United States Patent [19]

Dumont

[11] Patent Number: 4,539,659
[45] Date of Patent: Sep. 3, 1985

[54] SEMICONDUCTOR MEMORY HAVING A DYNAMIC DISCHARGE CIRCUIT

[75] Inventor: Daniel Dumont, Douvres, France

[73] Assignee: U.S. Philips Corporation, New York, N.Y.

[21] Appl. No.: 469,536

[22] Filed: Feb. 24, 1983

[30] Foreign Application Priority Data

Feb. 26, 1982 [FR] France ............................ 82 03237

[51] Int. Cl.³ ............................................. G11C 11/40
[52] U.S. Cl. ..................................... 365/226; 365/155
[58] Field of Search ............... 365/226, 227, 190, 155, 365/179, 203, 204

[56] References Cited

U.S. PATENT DOCUMENTS 4,295,210 10/1981 Beranger et al. ................... 365/227
4,400,802 8/1983 Rydval ................................ 365/226

Primary Examiner—Joseph A. Popek
Attorney, Agent, or Firm—Robert T. Mayer; Steven R. Biren

[57] ABSTRACT

A semiconductor memory includes a dynamic discharge circuit for the quick discharging of a power supply line to which a memory matrix row is connected when this power supply line changes over from the electrical selected state to the electrical rest state. A transistor which is rendered conductive by a dynamic potential difference which arises, due to the slow discharge of the power supply line, between this line and the selection circuit thereof, supplies a current for a brief period of time in order to achieve the quick discharging. The invention is typically used notably for the discharging of power supply lines of E.C.L.-type random access memories.

4 Claims, 2 Drawing Figures

SEMICONDUCTOR MEMORY HAVING A DYNAMIC DISCHARGE CIRCUIT

BACKGROUND OF THE INVENTION

The invention relates to a semiconductor memory comprising memory cells which are arranged in a matrix of rows and columns, each memory cell comprising two emitter-connected transistors whose collectors are cross-wire connected to the bases, the memory cells in a matrix row being connected parallel to one another between a first and a second power supply line, switching means being connected to the first power supply line in order to bring the first power supply line to a line selection potential or to a rest potential, and a current source being connected to the second power supply line in order to sustain data stored in each memory cell connected to said line. The switching means includes a first transistor which is connected to the first power supply line by way of its emitter and whose base receives voltage pulses in order to bring the first power supply line at the line selection potential and also includes a further transistor for discharging the first power supply line from the line selection potential to the rest potential or for discharging the second power supply line. The memory also includes detection means for detecting the end of a voltage pulse on the base of the first transistor and for controlling the further transistor, said detection means being at least indirectly connected to the base of the first transistor for this purpose.

A memory of this kind is known from Japanese Patent Application No. 54-35.915, dated Mar. 24, 1979 and published on Oct. 8, 1980 (publication No. 55-129.992); therein a static memory based on the E.C.L. technique is disclosed. Another prior-art memory circuit is shown in U.S. Pat. No. 4,156,941.

The present invention relates notably but not exclusively to RAM memories manufactured according to the E.C.L. (Emitter Coupled Logic) technique.

During normal operation, the cells of a row (the selected row) in a memory according to the present state of the art are connected to a high (selection) potential $V_H$ via a power supply line, all other cells of the other rows being at a low (rest) potential $V_B$ via a corresponding number of power supply lines. Upon a transition between two cells which belong to two different rows, the potential of the power supply line selected must be reduced as quickly as possible from $V_H$ to $V_B$. It is known that a power supply line for a row of memory cells has a comparatively high capacitance (capacitance of the aluminum tape which interconnects the 16, 32, 64 . . . cells of the row plus the self-capacitance of each cell). This high capacitance prevents the quick discharging of a row to the rest potential. It is known to generate a special discharge current at the instant of transition; this current is sometimes referred to as "additional current" and is applied to the power supply line to be discharged.

The switching over of this "additional current" between the power supply line to be discharged and the associated discharge circuit at the appropriate instant has been described in an article in an IEEE publication of January 1981, reference CH 1626, entitled "Large E.C.L. Bipolar RAMS" (pages 120–124, FIG. 11).

The described circuit utilizes a dynamic potential difference which arises at the instant of a transition $V_H \rightarrow V_B$ between two given points which are selected on either side of the addressing circuit which is connected to the power supply line for the row of cells (which notably comprises an addressing transistor which is referred to as the "first transistor" in the above publication). At the instant of the transition $V_H \rightarrow V_B$, the voltages on the two said points change; the voltage in the addressing circuit then immediately decreases from $V_H$ to $V_B$ because of the low-capacitance control circuit, while the voltage on the power supply line decreases comparatively slowly because its capacitance is comparatively high.

In accordance with the present state of the art said dynamic potential difference is detected by a differential amplifier which controls a second differential amplifier which applies an additional current to the power supply line to be discharged.

The use of this circuit indeed causes the quick discharging of the power supply line but also involves the drawback that the additional current source operates permanently, i.e. not only at the instants at which this additional current is acutally required. The additional current has an intensity of several mA and represents a substantial part of the quiescent current of the memory which cannot be ignored. This is a serious drawback with respect to energy consumption and, consequently, unnecessary heat is developed in the semiconductor memory. On the other hand, the proposed circuit is also complex and comprises many circuit elements so that a comparatively large amount of space is occupied on the semiconductor crystal of the memory.

SUMMARY OF THE INVENTION

A semiconductor memory in accordance with the present invention is based on the same principle as that in accordance with the present state of the art, but does not utilize a permanently active current source for the additional discharge current, so that the energy/heat dissipation is substantially reduced. Furthermore, the circuit in accordance with the inveniton is comparatively simple and comprises only few components, so that less space will be required.

A semiconductor memory in accordance with the invention is characterized in that the detection means comprise a second transistor whose emitter is connected to the first power supply line and whose base is at least indirectly connected to the base of the first transistor, the further transistor being controlled via the collector of the second transistor, the first and the second transistor being of a first and a second conductivity type, respectively.

The potential difference occurring between the power supply line and the base of the first transistor is detected by the base-emitter circuit of the second transistor which thus becomes conductive.

The current flowing through the second transistor is amplified by at least one transistor, which is referred to as the further transistor and which is of the first conductivity type. The discharge current obtained is applied either to the first power supply line or to the second power supply line.

In comparison with the present state of the art, the invention offers the fundamental advantage that an additional discharge current flows only for a few moments. At any other instant, regardless of whether the row is selected or in the rest state, the second transistor is maintained in the nonconductive state. This substantially reduces the energy consumption in the memory in comparison with the memory in accordance with the present state of the art. The invention also offers a saving of space on the semiconductor crystal on which the memory circuit is integrated. This is because the circuit in accordance with the invention comprises relatively few elements.

The emitter of the second transistor is preferably connected to the first power supply line of the row and hence also to the emitter of the first transistor. In order to obtain an appropriate bais voltage, in the rest condition the base of the second transistor, being connected to a current source, is also connected to the base of the first transistor via (in this sequence) a diode and the emitter-base path of a further transistor of the first conductivity type, the base and collector of which are connected parallel to the base and the collector of the first transistor. The previously-mentioned sets the static bias voltage between the emitter and the base of the second transistor, so that the latter assumes a state near the conductive state, with the result that the second transistor becomes conductive very quickly as soon as the power supply line and the row of memory cells change over from the selected to the non-selected state.

As will be apparent, there are alternate solutions for obtaining the desired static bias voltage setting. In an embodiment of the circuit which deviates slightly from the described embodiment and in which the emitter of the second transistor is also connected to the first power supply line of the row, said base is still connected to a current source and also to the emitter of a transistor of the first conductivity type whose base is connected to a tapping of a resistance bridge, one end of which is connected to the base of the first transistor while its other end is connected to the collectors of said transistors of the first conductivity type.

BRIEF DESCRIPTION OF THE DRAWING

The invention will be described in detail hereinafter with reference to the accompanying drawings, in which.

DESCRIPTION OF THE PREFERRED EMBODIMENTS

Figure 1:
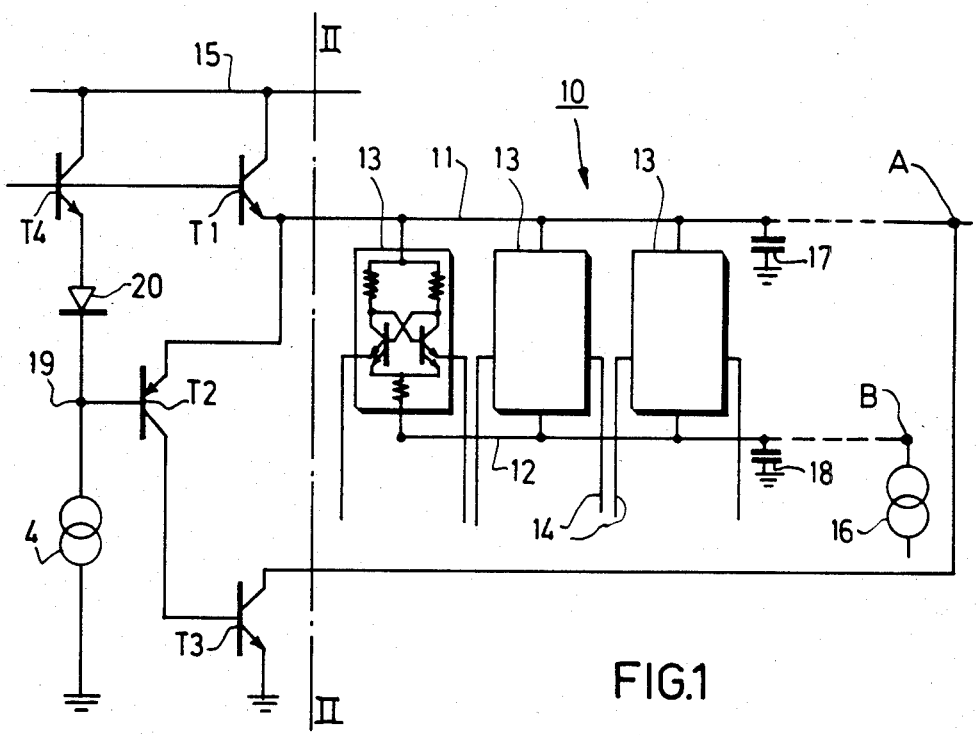
FIG. 1 shows the diagram of a memory circuit incorporating the invention.

FIG. 1 shows that a part of the memory circuit in accordance with the invention which relates to a single memory matrix row. For each of the rows of the matrix of the memory an identical circuit is used. The further parts of the memory, such as the column selection and read circuits etc. are known per se and will not be elaborated herein.

The memory matrix row 10 of FIG. 1 is formed in known manner and comprises a plurality of memory cells 13 which are connected in parallel between two power supply lines 11 and 12. In the present embodiment, the memory cells 13 are of the E.C.L.-type whose construction is well known. Said construction is shown in one of the rectangles 13 representing said cells: two transistors which comprise two emitters and which are connected as a flip-flop are connected to the second power supply line 12 via one of their emitters and a commone resistor. The second emitter of each transistor is connected to one of the column conductors. The bases and collectors, being cross-wise coupled, are connected to the first power supply line 11 by way of resistors. For the sake of clarity, no reference numerals are shown in the memory cells.

The first power supply line 11 is connected to the emitter of an npn-type transistor $T_1$ which is referred to as the first transistor. The collector of $T_1$ is connected to a positive voltage line 15. The base of $T_1$ carries the voltage pulses which control the state (selected or rest) of the power supply line 11.

The second power supply line 12 is connected to a current source 16 which is only diagrammatically shown and which serves to supply the cells 13 with the current required to sustain the data stored in the cells 13.

The power supply lines 11 and 12 of the memory cells 13 have a comparatively high electrical capacitance with respect to ground. This capacitance, being diagrammatically represented by the capacitors 17 and 18 which are connected between the relevant power supply lines 11 and 12 on the one side and ground on the other side, is higher as the lines 11 and 12 are longer and as the number of cells 13 is larger. During the transition of the power supply line 11 from the selected state (high voltage $V_H$ on the base of $T_1$), to the rest state (low voltage $V_B$ on the base of $T_1$), the voltage on the base side of $T_1$ will quickly change from $V_H$ to $V_B$, but the voltage on the lines 11 and 12 will decrease much more slowly because of the discharge period of the capacitors 17 and 18. Thus, between the base of $T_1$ and its emitter a dynamic potential difference arises during the discharging of the line 11. After detection in the memory circuit in accordance with the invention, this potential difference is used to form an instantaneous current for the quick discharging of the line 11 or 12. As has already been described, the memory circuit in accordance with the invention is characterized in that it comprises a transistor $T_2$ (referred to as the second transistor) of the second conductivity type (pnp-type in this case) whose emitter is connected to the power supply line of the row (in this case the line 11) and whose base is connected to a terminal 19 which is connected to a current source 4 and at least indirectly to the base of the transistor $T_1$, its collector being connected to one of the power supply lines 11 or 12 of the row 10 via at least one further npn-type transistor $T_3$. The collector of the second transistor $T_2$ is connected to the base of the transistor $T_3$. The emitter of $T_3$ is connected to ground, the collector of $T_3$ being connected to the line 11 at the area A. Alternatively, the collector of $T_3$ may be connected to the point B on the power supply line 12 instead of to point A on the power supply line 11.

Furthermore, the connection between the bases of $T_1$ and $T_2$ is indirect. The connection is established from terminal 19 by a diode 20 (whose cathode is connected to said terminal 19) and by the base-emitter junction of a transistor $T_4$ (npn-type) whose base and collector are connected in parallel with the base and the collector of $T_1$, respectively.

The diode 20 is provided in order to form an appropriate bias voltage between the base and the emitter of $T_2$ which, however, just fails to make $T_2$ conductive when the power supply line 11 carries the rest potential.

The base of $T_2$ is connected, via the terminal 19, to a current circuit which comprises, as from the bases of $T_1$ and $T_4$, the diode 20 and the current source 4. This current circuit has a very small capacitance with respect to the power supply line 11 or 12. Consequently, the voltage variations on the base of $T_2$ are substantially in synchronism with those on the base of $T_1$, while the voltage variation from $V_H$ to $V_B$ on the emitters of $T_1$ and $T_2$ is much slower because of the large capacitances 17 and 18.

During stable operation of the line 11 of the memory cells, the line being selected or not, the bias voltage of $T_2$ is such that $T_2$ is just blocked. When the line 11 receives a selection signal (i.e. a positive voltage pulse is applied to the base of $T_1$), the voltage increases on the base and the emitter of $T_2$ are substantially simultaneous and ultimately equal (in reality some always occurs on the side of the emitter because of the described capacitance ratios, and this delay contributes to the decreasing of the bias voltage of $T_2$). Thus, the transistor $T_2$ remains blocked the transition of the line 11 from the non-selected state to the selected state. This is contrary to the situation when $V_H$ changes to $V_B$; the voltage decrease on the base of $T_2$ is then rapid with respect to the voltage decrease on the emitter of $T_2$ because of the above considerations as regards the electrical capacitance. The base-emitter diode of the transistor $T_2$ then receives a voltage increase which suddenly renders this transistor conductive. The current starts to flow through $T_2$ and is amplified by $T_3$. The current amplified by $T_3$ is applied either to the line 11 at A or to the line 12 at B, thus accelerating the discharging of the capacitances 17 and 18. As the discharging process progresses, the voltage on the emitter of $T_2$ decreases and the voltage between the base and the emitter of $T_2$ will soon be such that this transistor is blocked again.

It is to be noted that the additional discharge current is present only for a brief period during which such a current is indeed required. This is contrary to the procedure in the circuits in accordance with the present state of the art which comprise discharge current sources which operate permanently and whose current is correctly switched over to the row of cells at the instant at which this row is no longer selected.

The drawing shows only a single amplification transistor $T_3$ for the current passing through $T_2$. The introduction of a second amplification transistor (if necessary in cascade with $T_3$) will hardly complicate the circuit, which is characterized by its simplicity. It has been found in practice that it is sufficient to use a single planar pnp-type amplification transistor for the second transistor which has a sufficiently high gain factor and which is formed in an integrated circuit.

The choice of the connection of the collector of $T_3$ to A or to B on the power supply line 11 or 12 is made depending on factors such as the waveform of the voltage or current resulting from this connection, at other points of the circuit, or the speed obtained in the one or in the other case. The connection to the point A results in a very high discharge speed. This discharge speed can best be adapted to switching speeds of other parts of the memory.

Figure 2:
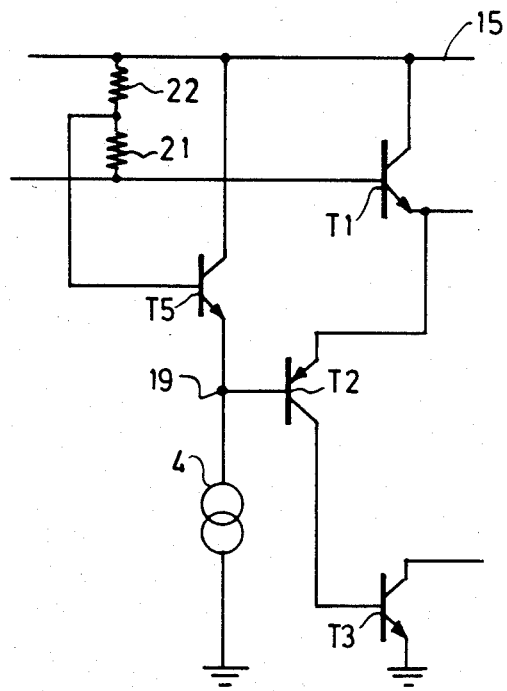
FIG. 2 shows an alternative embodiment of a part of the memory circuit of FIG. 1.

FIG. 2 shows an alternative embodiment of a part of the circuit of FIG. 1 (situated to the left of the stroke/-dot line II—II in FIG. 1). This alternative aims to supply the transistor $T_2$ with a bias voltage in the rest state in a different manner. FIG. 2 again shows the transistors $T_1$, $T_2$, $T_3$ which are interconnected in the same way as shown in FIG. 1. Also shown is the current source 4 which is connected to the terminal 19 which in its turn is connected to the base $T_2$. However, the terminal 19 is now also connected to the emitter of an npn-type transistor $T_5$ whose collector is connected to the voltage line 15. The base of $T_5$ is connected to the tapping of a bridge which consists of two resistors 21 and 22 and which is connected between the base of $T_1$ and the line 15. Evidently, the value of the bias voltage of the transistor $T_2$ depends on the ratio of the values of the resistors 20 and 21. This is inter alia a method for the control of the bias voltage of $T_2$ and for the adjustment of the capacitance ratios between the base side and the emitter side of $T_1$ which determine the instant and the duration for the supply of the additional discharge current.

What is claimed is:

1. A semiconductor memory comprising memory cells which are arranged in a matrix of rows and columns, each memory cell comprising two emitter-connected transistors whose collectors are cross-wise connected to the bases, the memory cells in a matrix row being connected parallel to one another between a first and a second power supply line, switching means being connected to the first power supply line in order to bring the first power supply line to a line selection potential or to a rest potential, a current source being connected to the second power supply line in order to sustain data stored in each memory cell connected to said line, said switching means comprising a first transistor which is connected to the first power supply line by way of its emitter and whose base receives voltage pulses in order to bring the first power supply line to the line selection potential and also comprising a further transistor for the discharging of the first power supply line from the line selection potential to the rest potential or for the discharging of the second power supply line, said memory also comprising detection means for detecting the end of a voltage pulse on the base of the first transistor and for controlling the further transistor, said detection means being at least indirectly connected to the base of the first transistor for this purpose, characterized in that the detection means comprise a second transistor whose emitter is connected to the first power supply line and whose base is at least indirectly connected to the base of the first transistor, the further transistor being controlled via the collector of the second transistor, the first and the second transistor being of a first and a second conductivity type, respectively.

2. A semiconductor memory as claimed in claim 1, characterized in that the base of the second transistor is connected to the base of the first transistor via a diode and an emitter base junction of a fourth transistor, the fourth transistor being of the first conductivity type and its base and collector being connected to the base and the collector, respectively, of the first transistor, the diode being connected to the base of the second transistor by way of its cathode, a current source also being connected to the second transistor.

3. A semiconductor memory as claimed in claim 1, characterizedf in the base of the second transistor is connected to a current source and to the emitter of a fourth transistor of the first conductivity type, the collector thereof being connected to the collector of the first transistor while the base of the fourth transistor is connected to the tap of of voltage divider which is connected between the base and the collector of the first transistor.

4. A semiconductor memory as claimed in claim 1, 2 or 3, characterized in that the second transistor is a planar pnp-type transistor.

* * * * *

UNITED STATES PATENT AND TRADEMARK OFFICE
CERTIFICATE OF CORRECTION

PATENT NO. : 4,539,659
DATED : September 3, 1985
INVENTOR(S) : DANIEL DUMONT

It is certified that error appears in the above-identified patent and that said Letters Patent is hereby corrected as shown below:

IN THE ABSTRACT: line 11, delete "notably".

IN THE CLAIMS:

Claim 3, line 2, change "characterizedf" to --characterized--;

line 7, "of" (second occurrence) should read -- a --.

Signed and Sealed this

Sixth Day of January, 1987

Attest:

DONALD J. QUIGG

Attesting Officer — Commissioner of Patents and Trademarks